United States Patent [19]
Etter

[11] Patent Number: 5,585,715
[45] Date of Patent: Dec. 17, 1996

[54] BIDIRECTIONAL ELECTRIC CURRENT SENSOR FED FROM A UNIPOLAR SOURCE

[75] Inventor: Marcel Etter, Troinex, Switzerland

[73] Assignee: Liaisons Electroniques- Mechaniques LEM S.A., Plan-Les-Quates, Switzerland

[21] Appl. No.: 481,312
[22] PCT Filed: Oct. 12, 1994
[86] PCT No.: PCT/CH94/00203
§ 371 Date: Jun. 30, 1995
§ 102(e) Date: Jun. 30, 1995
[87] PCT Pub. No.: WO95/12819
PCT Pub. Date: May 11, 1995

[30] Foreign Application Priority Data

Nov. 2, 1993 [CH]  Switzerland ............ 3296/93

[51] Int. Cl.$^6$ .............. G01R 33/07; G01R 1/20
[52] U.S. Cl. ..................... 324/117 H; 324/127
[58] Field of Search ............. 324/117 H, 117 R, 324/99 D, 99 R, 127

[56] References Cited

U.S. PATENT DOCUMENTS

| | | | |
|---|---|---|---|
| 3,323,057 | 5/1967 | Haley ............... | 324/117 H |
| 3,422,351 | 1/1969 | Phil ................. | 324/117 H |
| 3,885,212 | 5/1975 | Herbert ............. | 324/117 H |
| 5,451,865 | 9/1995 | Coburn .............. | 324/127 |

Primary Examiner—Ernest F. Karlsen
Attorney, Agent, or Firm—Clifford W. Browning; Woodard, Emhardt, Naughton Moriarty & McNett

[57] ABSTRACT

A sensor of the type comprising a magnetic circuit coupled to the lead, wherein circulates the current to be measured and presenting an airgap wherein is arranged a Hall cell (3) and coupled to a compensation coil (5) supplied, as well as the Hall cell, by a unipolar current source ($V_+$, earth), comprises a four-branch bridge supply circuit wherein the coil (5) is connected to form a diagonal. The current source and a measurement resistor (R) are mounted in series with said bridge circuit. The variable conduction elements (8, 9, 15, 16) are mounted in the four branches of the bridge and are so controlled as to cause a make-up current to circulate in the coil (5), in one direction or the other, as a function of the residual flow direction indicated by the Hall cell (3), through two respective opposite branches of the bridge circuit. The other two opposite branches being non-conductive.

10 Claims, 2 Drawing Sheets

BIDIRECTIONAL ELECTRIC CURRENT SENSOR FED FROM A UNIPOLAR SOURCE

The present invention relates to an electric current sensor device for measuring the current flowing in a primary conductor comprising at least one magnetic circuit arranged for being coupled with the primary conductor, this circuit having an airgap in which a Hall cell is arranged which provides a signal as a function of the magnetic field in the airgap, at least one electric coil being coupled with the magnetic circuit, the Hall cell and said coil being part of an electric measuring circuit fed from a current source, this measuring circuit comprising at least a current supply circuit for the coil so as to cause a compensating current to circulate therein and a control circuit for controlling this supply circuit as a function of the Hall cell signal for aiming at cancelling the magnetic field in the airgap of the magnetic circuit, this field resulting from the effect of the current to be measured and of the compensating current circulating in the coil, and means for measuring said compensating current.

SUMMARY OF THE INVENTION

The invention aims at providing a current sensor device of this type allowing the measurement of a bidirectional current while being fed from a unipolar current source. Such a requirement exists in particular in an electric car in which a single battery, for example of 12 volt, feeds the auxiliary devices and the headlights.

The sensor device according to the invention is characterized in that, the current source being unipolar with respect to ground, the current supply circuit for the coil is constructed in the form of a four-branch bridge circuit, in which the coil is connected so as to constitute a diagonal, the current source and a measuring resistor being connected in series between a common connection point of two first branches of the bridge which are connected, on the other hand, to respective terminals of the coil, and the ends of the two further branches of the bridge, controlled variable conduction elements being mounted, respectively, in the four branches of the bridge, said control circuit of the current supply circuit of the coil being arranged for controlling said variable conduction elements so as to cause the compensating current to flow in the coil, in one direction or the other depending on the the direction of the residual flux detected by the Hall cell, through two respective opposite branches of the bridge circuit, the other two opposite branches being non-conducting.

In another embodiment of the invention the variable conduction elements are transistors (8, 9, 15, 16), the conduction paths of which form the branches of the bridge circuit and the control electrodes of which are controlled through the signal from the Hall cell (3) so that one of the transistors (8 or 9) in two opposite branches of the bridge is more or less conductive as a function of the magnitude of this signal, that the other of these transistors (15 or 16) is conductive and has a minimum resistance, and that the two other transistors of the bridge are non-conductive.

In another embodiment of the invention, the two transistors (8, 9) of the bridge, one of which is more or less conductive at one and the same time, are connected, directly or through a measuring resistor (R), to the same terminal ($V_+$ or O) of the current source.

In another embodiment of the invention, the control circuit comprises an amplifier (7) having two inputs connected to the output terminals of the Hall cell (3), the output of this amplifier being connected, on the one hand, for controlling a first (9) or a second (8) of the transistors connected to the same terminal of the current source depending on whether the output voltage of the amplifier (7) is higher or lower than a reference voltage and, on the other hand, for controlling the transistors (16, 15) connected in the opposite branches of the bridge to render conductive or non-conductive, respectively, one or the other of these latter transistors depending on whether the output voltage of the amplifier (7) is higher or lower than the reference voltage.

In another embodiment of the invention, the output of the amplifier (7) for the Hall cell signal is connected to the base of a first control transistor (10), the two other electrodes of which are connected, respectively, to the intermediate point of a voltage divider (11, 12) determining the reference voltage and to the control electrode of the first transistor (9) of the bridge, the output of the amplifier (7) being further connected through a resistor (14) to an electrode of the conduction path of a second control transistor (13), the control electrode of which is connected to the intermediate point of the voltage divider (11, 12) and the other electrode of the conduction path of which is connected to the control electrode of the second transistor (18) of the bridge.

In another embodiment of the invention, the output of the amplifier (7) for the Hall cell signal is connected to a first input of a comparator circuit (17, 18) the second input of which is connected to the intermediate point of the voltage divider (11, 12) and that the outputs of this comparator circuit are connected for controlling the transistors (15, 16) of the branches opposite to those of the first and second transistors (8, 9) of the bridge, so as to render the same, respectively, conductive or non-conductive depending on the signals provided by the comparator circuit (17, 18).

In another embodiment of the invention, the terminals (28, 29) of the coil (5) are connected through a respective feed-back circuit (21, 22, 23–27) to an input of the amplifier (7) for the Hall cell signal, one of these feed-back circuits comprising an inverter (25) so that the feed-back signals obtained are adapted to the polarity of the current in the coil.

In another embodiment of the invention, the controlled variable conduction elements of the current supply circuit for the coil are, at least in part, MOS transistors.

In another embodiment of the invention, the signals provided by the comparator circuit (at S) is applied to the measuring circuit for indicating the direction of the current being measured.

In another embodiment of the invention, the circuit formed, respectively, by two opposite branches of the bridge circuit between which is connected the coil, is connected to a respective measuring resistor ($R_1$; $R_2$) so as to provide a separate measuring signal for one or the other of the directions of the current being measured.

BRIEF DESCRIPTION OF THE DRAWING FIGURES

Other features and advantages of the present invention will appear from the following description of an example of an embodiment illustrated by the appended drawing, wherein:

FIG. 1 is an electric diagram of the measuring circuit of a sensor device according to the invention; and FIG. 2 is a partial diagram illustrating a variant of the circuit of FIG. 1.

DETAILED DESCRIPTION OF THE PREFERRED EMBODIMENT

The present current sensor device operates according to the compensation principle, such as described, for example, in the U.S. Pat. No. 4,939,449, which is the English language equivalent of Swiss patent No. 677034, the content of which is considered to be part of the present description. This type of sensor can in fact be constructed so as to achieve the precisions required in certain applications, such as the measuring of the charging and discharging currents of batteries, particularly with a view to calculating the state of the charge thereof.

Figure 1:
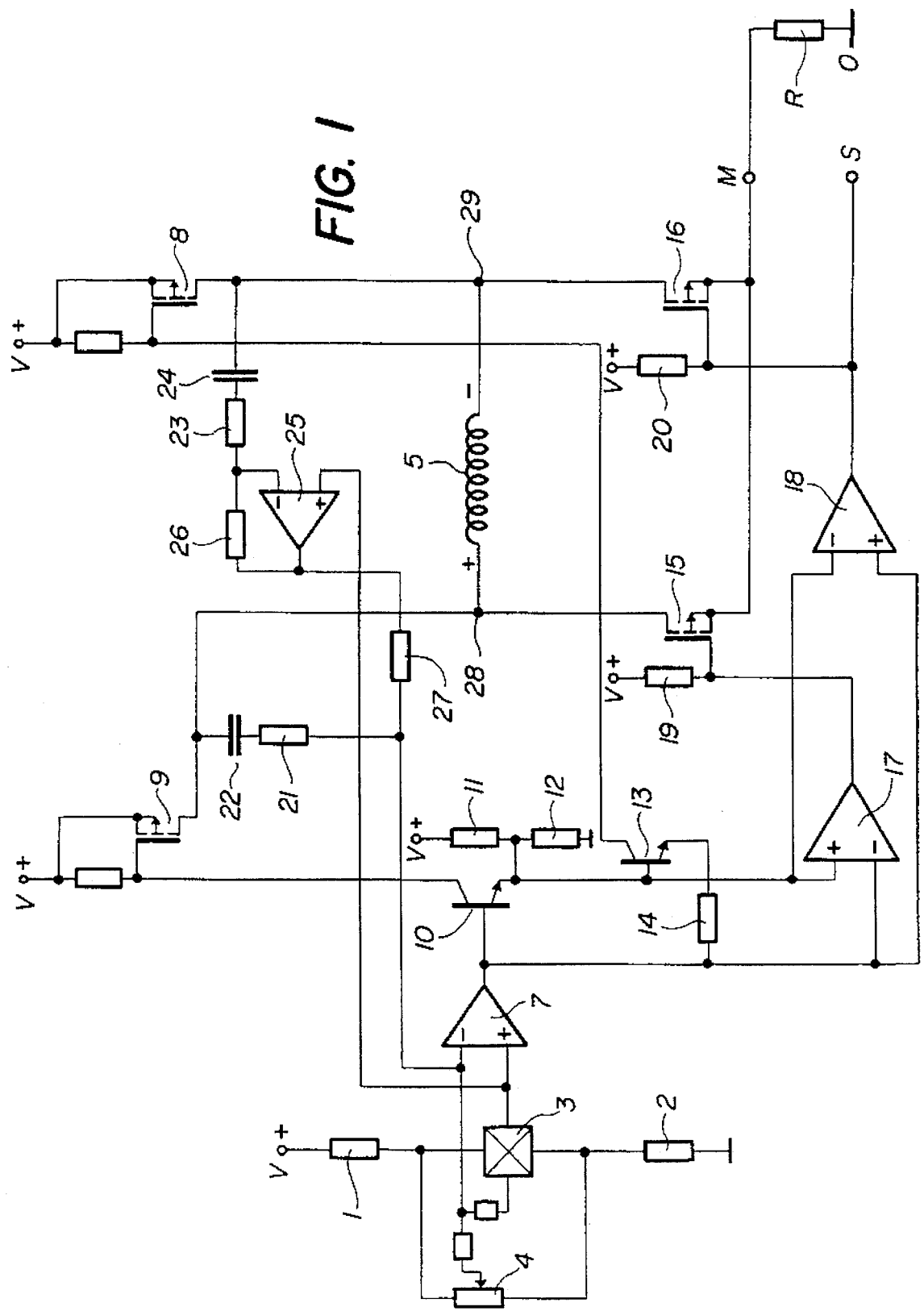

In the example of FIG. 1, a Hall cell 3 is supplied through resistors 1 and 2 from a battery the poles of which are indicated by $V_+$ and, for ground, 0. The signal provided by this Hall cell as a function of the residual flux in the magnetic circuit of the sensor, is applied to the plus and minus input terminals (+, −) of an amplifier 7. A potentiometer 4 allows to compensate in a known manner, the offset voltages of the Hall generator and the input of the amplifier 7.

On this occasion, it is to be noted that according to another embodiment of the measuring circuit, the current supply of the Hall cell can be inversed when the measured current changes in direction. However, in practice, this requires components with very low offset voltages in compliance with the precision requirements of the device.

A compensation coil 5, coupled with the magnetic circuit of the sensor, is fed from the same battery through a bridge circuit the four branches of which comprise controlled variable conduction elements, for example MOS transistors designated, respectively, by 8, 9, 15 and 16, the coil 5 constituting a diagonal of this bridge circuit between the terminals 28 and 29. A measuring resistor R is connected in series with the supply battery between the common connection point $V_+$ of the conduction pathes of the transistors 8, 9 and ground 0.

The signal appearing at the output of the amplifier 7 is applied, on the one hand, through an amplifying transistor 10 to the gate of the transistor 9 and, on the other hand, through a resistor 14, to the emitter of the transistor 13 which controls the gate of the MOS transistor 8. The emitter of transistor 10 and the base of transistor 13 are connected to the intermediate point of a voltage divider 11, 12 which determines a reference voltage. Accordingly, depending on the magnitude of the signal provided by the amplifier 7 with respect to this reference voltage, the one or the other of the MOS transistors 9 and 8 will be rendered conductive as a function of the absolute value of the difference between the magnitude of the output signal 7 and the reference voltage. As it is, the transistor 9 will be conductive for values of the output signal of amplifier 7 higher than the reference voltage and the MOS transistor 8 for values lower than this reference voltage.

The signal from amplifier 7 is further applied to a comparator circuit 17, 18, another input of which is connected to the intermediary point of the voltage divider 11, 12 determining the reference voltage. In the example of FIG. 1, two comparators 17 and 18 are connected in parallel and have their respective inputs inverted, and their outputs are connected, respectively, to the gates of the MOS transistors 15 and 16 which are biased through resistors 19 and 20, so as to be totally non-conductive or conducting in accordance with the state of the outputs of comparators 17 and 18.

In this way, when the output voltage of amplifier 7 is more positive than the reference voltage, the MOS transistor 16 will become conducting and the current flows through the coil 5 in the direction of plus, minus (+, −) indicated in FIG. 1, this current being provided through the transistor 9 as a function of the magnitude of the output signal of the amplifier 7. On the other hand, when this signal becomes smaller than the reference voltage, an inverse compensating current will flow in the coil 5 through the transistors 8 and 15, i.e. in the direction minus, plus (−, +) of FIG. 1. In both cases, the compensating current, i.e. the current proportional to the current to be measured, provides a positive measuring voltage on the terminal M of the resistor R. On the terminal S, the output of the comparator 18 will provide a logical signal indicating the direction of the measured current.

Figure 2:
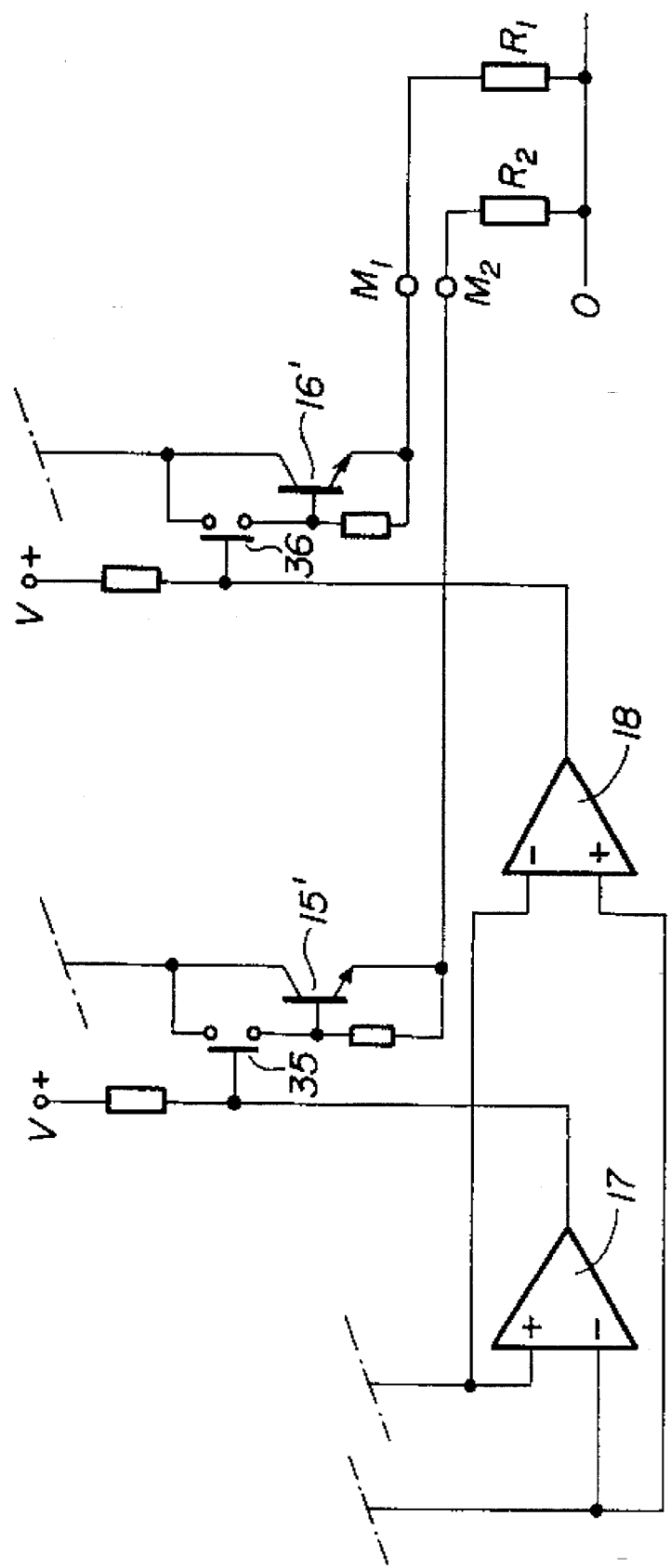

According to an alternative embodiment illustrated in FIG. 2, each of the circuits formed, respectively, by two opposite branches of the bridge circuit between which the coil 5 is connected, i.e. 9, 5, 16 and 8, 5, 15, can be separately connected to respective measuring resistors $R_1$ and $R_2$ of identical value so that, depending on the direction of the measured primary current, a corresponding measuring voltage appears on the respective terminal M1 or M2 of one or the other of these measuring resistors. These signals can be directly used by such microprocessors as often used for processing currents provided by the present device.

To stabilize the control loop of the compensating current in the present device, a feed-back of the supply voltage for the coil to the minus input (−) of the amplifier 7 is provided according to the diagram of FIG. 1. As to the terminal 28 of the coil 5 connected to the transistor 9, a RC-circuit 21, 22 is directly connected to the minus (−) input of amplifier 7. For the inverse compensating current provided through transistor 8, the direction of the variations is inversed and, consequently, an inverter-amplifier 25 is provided in addition to a RC-circuit 23, 24 identical to the circuit 21, 22. This RC-circuit is connected to the minus (−) input of the amplifier 25, the plus (+) input of which is connected to the plus (+) input of amplifier 7. Two resistors of identical value 26 and 27 are connected, respectively, between the output of the amplifier 25 and its minus (−) input, and between this output et the minus (−) input of amplifier 7. Two feed-back current sources are thus directly and permanently connected to the minus (−) input of the amplifier 7. The two currents being of opposite phases, the resulting feed-back current finally takes into account the voltage on the terminals of the coil alone, independently of the value of the measuring resistor R. An excellent stability of the circuit is thus achieved without need of a switching operation for connecting the one or the other of the feed-back circuits as a function of the direction of the compensating current.

FIG. 2 illustrates, besides the use of two separate measuring resistors, the use of bipolar transistors instead of the MOS transistors 15 and 16 of FIG. 1. In this case, the bases of the transistors 15' and 16' are put at the potential of the respective collector by closing the analog switches 35, 36 controlled by the comparators 17 and 18. The remainder of the diagram which is similar to that of FIG. 1 has not been reproduced in FIG. 2.

I claim:

1. An electric current sensor device for measuring a current flowing in a primary conductor, comprising at least one magnetic circuit arranged for being coupled with said primary conductor, said magnetic circuit having an airgap, a Hall cell arranged in said airgap for providing a Hall cell signal as a function of the magnetic field in said airgap, at least one electric coil being coupled with said magnetic circuit, said Hall cell and said coil being part of an electric measuring circuit fed from a unipolar current source, said measuring circuit further comprising at least a current supply circuit for said coil so as to cause a compensating current to circulate therein, a control circuit for controlling said current supply circuit as a function of said Hall cell signal and measuring means for measuring said compensating current, said current supply circuit for the coil being a four-branch bridge circuit, in which said coil is connected so as to constitute a diagonal, said current source and a measuring resistor being connected in series between a common connection point of first ends of two first branches of said bridge circuit, second ends of said first branches being connected to respective terminals of said coil, and first ends of two second branches of said bridge, controlled variable conduction elements being inserted, respectively, in the four branches of said bridge circuit, said control circuit of the current supply circuit for said coil being arranged for controlling said variable conduction elements so as to cause said compensating current to flow in said coil in either direction, depending on the direction of a residual magnetic flux detected by said Hall cell, by rendering two respective mutually opposite branches of said bridge circuit conducting while rendering the remaining two mutually opposite branches non-conducting.

2. A device according to claim 1, wherein said variable conduction elements are transistors the conduction paths of which are connected to form the branches of said bridge circuit and are controlled through said Hall cell signal, so as to render one of said transistors in two mutually opposite branches of said bridge circuit conductive to a degree depending on the magnitude of said Hall cell signal, and to render the other of said transistors in said two mutually opposite branches conductive with a minimum resistance, while the two remaining transistors of said bridge circuit are rendered non-conductive.

3. A device according to claim 2, wherein said two transistors of said bridge which are controlled for being rendered conductive to a degree depending on the magnitude of said Hall cell signal, are connected, directly or through a measuring resistor, to a same terminal of said current source.

4. A device according to claim 3, wherein said control circuit comprises an amplifier having two inputs connected to output terminals of said Hall cell, the output of said amplifier being connected, on the one hand, for controlling a first or a second of said transistors connected to the same terminal of said current source depending on whether the output voltage of said amplifier is higher or lower than a reference voltage and, on the other hand, for controlling said transistors connected in respective opposite branches of said bridge circuit to render conductive or non-conductive, respectively, one or the other of these latter transistors depending on whether the output voltage of said amplifier is higher or lower than said reference voltage.

5. A device according to claim 4, wherein said output of the amplifier for said Hall cell signal is connected to the base of a first control transistor, the two other electrodes of which are connected, respectively, to an intermediate point of a voltage divider determining said reference voltage and to a control electrode of said first transistor of said bridge circuit, the output of said amplifier being further connected through a resistor to a first electrode of the conduction path of a second control transistor, the control electrode of which is connected to said intermediate point of said voltage divider and the second electrode of the conduction path of which is connected to said control electrode of said second transistor of said bridge circuit.

6. A device according to claim 5, wherein said output of the amplifier for said Hall cell signal is connected to a first input of a comparator circuit the second input of which is connected to said intermediate point of said voltage divider and the outputs of said comparator circuit are connected for controlling said transistors of the bridge circuit branches opposite to those of said first and second transistors, so as to render the same, respectively, conductive or non-conductive depending on control signals provided by said comparator circuit.

7. A device according to claim 4, wherein said terminals of said coil are connected through a respective feed-back circuit to an input of said amplifier for said Hall cell signal, one of said feed-back circuits comprising an inverter so that the provided feed-back signals are adapted to the direction of the current in said coil.

8. A device according to claim 1, wherein said controlled variable conduction elements of said current supply circuit for the coil are, at least in part, MOS transistors.

9. A device according to claim 6, wherein one of said signals provided by said comparator circuit is applied to said measuring circuit for indicating the direction of the current being measured.

10. A device according to claim 1, wherein each circuit formed, respectively, by two opposite branches of said bridge circuit between which is connected said coil, is connected to a respective measuring resistor for providing a separate measuring signal in either of the directions of said current being measured.

* * * * *

UNITED STATES PATENT AND TRADEMARK OFFICE
CERTIFICATE OF CORRECTION

PATENT NO. : 5,585,715
DATED : December 17, 1996
INVENTOR(S) : Marcel Etter, Troinex, Switzerland It is certified that error appears in the above-indentified patent and that said Letters Patent is hereby corrected as shown below:

On the title page:

Item:    73 please delete "Mechaniques" and insert in lieu thereof --Mécaniques--.

Item:    73 please delete "Plan-Les-Quates" and insert in lieu thereof --Plan-Les-Ouates.

Signed and Sealed this

Twenty-ninth Day of April, 1997

Attest:

BRUCE LEHMAN

Attesting Officer    Commissioner of Patents and Trademarks